(12) United States Patent
Sartschev et al.

(10) Patent No.: US 7,856,578 B2
(45) Date of Patent: Dec. 21, 2010

(54) STROBE TECHNIQUE FOR TEST OF DIGITAL SIGNAL TIMING

(75) Inventors: Ronald A. Sartschev, Andover, MA (US); Ernest P. Walker, Weston, MA (US)

(73) Assignee: Teradyne, Inc., North Reading, MA (US)

( * ) Notice: Subject to any disclaimer, the term of this patent is extended or adjusted under 35 U.S.C. 154(b) by 689 days.

(21) Appl. No.: 11/234,542

(22) Filed: Sep. 23, 2005

(65) Prior Publication Data

US 2007/0091991 A1    Apr. 26, 2007

(51) Int. Cl.
*G11B 5/00* (2006.01)
*G01R 31/28* (2006.01)
(52) U.S. Cl. .................. 714/700; 714/731; 714/744
(58) Field of Classification Search ............ 714/731, 714/744, 726, 730, 700; 326/93
See application file for complete search history.

(56) References Cited

U.S. PATENT DOCUMENTS

| | | | | |
|---|---|---|---|---|
| 3,363,183 | A | | 1/1968 | Bowling et al. ............. 328/63 |
| 3,471,790 | A | | 10/1969 | Kaps ........................ 328/63 |
| 3,612,906 | A | | 10/1971 | Kennedy ................... 307/269 |
| 3,947,697 | A | | 3/1976 | Archer et al. ............. 307/208 |
| 3,997,740 | A | * | 12/1976 | Eubank et al. ............. 379/31 |
| 4,014,238 | A | * | 3/1977 | Southard .................... 84/682 |
| 4,119,910 | A | | 10/1978 | Hayashi .................. 324/83 R |
| 4,415,984 | A | * | 11/1983 | Gryger et al. ............. 713/401 |
| 4,488,108 | A | | 12/1984 | Treise et al. ............. 324/83 D |
| 4,686,458 | A | | 8/1987 | Beyerbach et al. ....... 324/83 D |
| 4,989,202 | A | * | 1/1991 | Soto et al. ................. 370/244 |
| 5,003,194 | A | | 3/1991 | Engelhard ................. 307/265 |
| 5,084,669 | A | * | 1/1992 | Dent ...................... 324/76.82 |
| 5,258,968 | A | | 11/1993 | Matsuda et al. .......... 369/44.35 |
| 5,293,079 | A | | 3/1994 | Knoch ....................... 307/234 |

(Continued)

FOREIGN PATENT DOCUMENTS

WO    WO/2007/038233    4/2007

OTHER PUBLICATIONS

Eby G. Friedman, "Clock Distribution Networks in Synchronous Digital Integrated Circuits", Proceedings of the IEEE, vol. 89, No. 5, May 2001, pp. 665-692.

(Continued)

*Primary Examiner*—Robert Beausoliel
*Assistant Examiner*—Daniel F McMahon
(74) *Attorney, Agent, or Firm*—Wolf, Greenfield & Sacks, P.C.

(57) ABSTRACT

A test system timing method simulates the timing of a synchronous clock on the device under test. Strobe pulses can be generated by routing an edge generator to delay elements with incrementally increasing delay values. A data signal or synchronous clock signal can be applied to the input of each of a set of latches which are clocked by the strobe pulses. An encoder can convert the series of samples which are thereby latched to a word representing edge time and polarity of the sampled signal. If the sampled signal is a data signal, the word can be stored in memory. If the sampled signal is a clock signal, the word is routed to a clock bus and used to address the memory. The difference between clock edge time and data edge time is provided and can be compared against expected values.

5 Claims, 4 Drawing Sheets

U.S. PATENT DOCUMENTS

| | | | | |
|---|---|---|---|---|
| 5,321,700 | A | | 6/1994 | Brown et al. .................. 371/27 |
| 5,381,100 | A | | 1/1995 | Hayashi ..................... 324/601 |
| 5,483,534 | A | * | 1/1996 | Ohki et al. .................. 370/535 |
| 5,499,190 | A | * | 3/1996 | Takahashi et al. ............. 702/71 |
| 5,568,071 | A | | 10/1996 | Hoshino et al. ............... 377/43 |
| 5,818,849 | A | | 10/1998 | Komatsu |
| 6,167,495 | A | * | 12/2000 | Keeth et al. .................. 711/167 |
| 6,173,207 | B1 | * | 1/2001 | Eidson ........................ 700/14 |
| 6,198,700 | B1 | * | 3/2001 | Sassoon ..................... 368/113 |
| 6,204,710 | B1 | * | 3/2001 | Goetting et al. ............. 327/276 |
| 6,233,528 | B1 | | 5/2001 | Lai et al. ...................... 702/69 |
| 6,285,722 | B1 | * | 9/2001 | Banwell et al. ............. 375/354 |
| 6,291,981 | B1 | | 9/2001 | Sartschev ................ 324/76.82 |
| 6,377,065 | B1 | * | 4/2002 | Le et al. ..................... 324/765 |
| 6,437,589 | B1 | | 8/2002 | Sugano ...................... 324/763 |
| 6,470,405 | B2 | * | 10/2002 | Barth et al. ................. 710/100 |
| 6,556,640 | B1 | | 4/2003 | Baba |
| 6,606,360 | B1 | | 8/2003 | Dunning et al. |
| 6,643,810 | B2 | | 11/2003 | Whetsel |
| 6,715,111 | B2 | | 3/2004 | Self et al. |
| 6,735,543 | B2 | | 5/2004 | Douskey et al. ............. 702/120 |
| 6,771,061 | B2 | | 8/2004 | Sartschev et al. ........ 324/158.1 |
| 6,868,047 | B2 | | 3/2005 | Sartschev et al. .......... 368/118 |
| 6,965,224 | B1 | * | 11/2005 | Hey ........................ 324/76.53 |
| 6,990,613 | B2 | * | 1/2006 | Doi et al. .................... 714/700 |
| 7,054,374 | B1 | | 5/2006 | Jensen et al. |
| 7,266,738 | B2 | * | 9/2007 | Sato ........................... 714/718 |
| 2003/0046622 | A1 | | 3/2003 | Whetsel |
| 2004/0260492 | A1 | | 12/2004 | Halle et al. |
| 2005/0157780 | A1 | | 7/2005 | Werner et al. |
| 2005/0157781 | A1 | | 7/2005 | Ho et al. |
| 2007/0071080 | A1 | | 3/2007 | Sartschev et al. |
| 2007/0126487 | A1 | | 6/2007 | Sartschev et al. |

OTHER PUBLICATIONS

Grochowski et al., "Integrated Circuit Testing for Quality Assurance in Manufacturing: History, Current Status, and Future Trends", IEEE Transactions on Circuits and Systems-II: Analog and Digital Signal Processing, vol. 44, No. 8, Aug. 1997, pp. 610-633.

Chang et al., "A Wide-Range Delay-Locked Loop With a Fixed Latency of One Clock Cycle", IEEE Journal of Solid-State Circuits, vol. 37, No. 8, Aug. 2002, pp. 1021-1027.

Dr. Paul D. Franzon, ECE 733 Class Notes, www.ece.ncsu.edu/erl/faculty/paulf.html, numbered 12-47.

International Search Report and Written Opinion for Application No. PCT/US06/37100 mailed on Sep. 25, 2007, 10 pages.

International Search Report and Written Opinion of Application No. PCT/US06/37099 mailed on Sep. 18, 2007, 6 pages.

International Search Report and Written Opinion for Application No. PCT/US2006/036912 mailed on Oct. 30, 2008, 11 pages.

Notice of Allowance for U.S. Appl. No. 11/234,599 dated Jan. 12, 2009.

Office Action for U.S. Appl. No. 11/234,599 dated Aug. 29, 2008.

Notice of Allowance for U.S. Appl. No. 11/234,814 dated Feb. 24, 2009.

Office Action for U.S. Appl. No. 11/234,814 dated Nov. 12, 2008.

Office Action for U.S. Appl. No. 11/234,814 dated Jul. 24, 2008.

* cited by examiner

STROBE TECHNIQUE FOR TEST OF DIGITAL SIGNAL TIMING

FIELD OF THE INVENTION

The present invention relates generally to automatic testing of semi-conductor chips and more specifically to clocking of automatic test equipment.

BACKGROUND OF THE INVENTION

Automatic test equipment (ATE) is universally used to test semi-conductor chips and integrated circuits during their manufacture. Functional testing is typically performed by configuring the ATE to apply electrical signals to numerous connection points on the device under test (DUT) while measuring the output response of the DUT at certain connection points.

ATE typically determines the relative timing between applied input signals and measured output signals when evaluating the performance of a DUT. Very accurate timing of the test system clock is often required to ensure that appropriate data is collected, particularly when evaluating a DUT's response to high speed signals.

It is often desirable to test the performance of a DUT relative to its own system clock. Accordingly, ATE can typically be configured to measure output at times relative to the DUT's internal clock. However, measurements relative to the DUT's system clock can be inaccurate at high data rates and clock speeds because signal slewing and jitter significantly affect measurement results.

Many integrated circuits (ICs) now include buses with a synchronous clock that accompanies the data. It is impractical to access a DUT's synchronous internal clock without tying up valuable test system hardware channels. It has also heretofore been problematic to use a test system clock to test data on buses having a synchronous clock because data on the bus may have very high jitter relative to the test system clock.

SUMMARY OF THE INVENTION

Embodiments of the present invention can allow a test system to test the timing of a synchronous bus using test system clocking to emulate the synchronous clock of the device under test. In an exemplary embodiment, a set of closely spaced strobe pulses is generated by routing an edge generator to a series of delays with incrementally increasing delay values. A data signal or clock signal is applied to the input of each of a set of parallel latches which are clocked by the closely spaced strobe pulses. The set of parallel latches thereby capture a single shot series of closely spaced samples of the data signal or clock signal. An encoder converts the single shot series of samples to a word representing edge time and polarity of the sampled signal. If the sampled signal is a data signal, the word is stored in RAM. If the sampled signal is a clock signal, the word is routed to a clock bus and used to address the RAM. The difference between clock edge time and data edge time is provided and can be compared against expected values.

In an illustrative embodiment, the present invention provides a method for testing timing of a synchronous bus by applying a strobe to data signals of a device under test. The strobe includes a plurality of pulses. The state of the data signals at the time of each strobe pulse of the strobe is stored. The strobe is also applied to a clock signal of the device under test. The stored states of the data signals are compared with the states of the clock signal at the time of each strobe pulse. In the illustrative embodiment, the strobe pulses are uniformly and equally spaced.

A particular embodiment of the invention reads the stored state of the data signal at the time corresponding to a strobe pulse at which a state change of the clock signal occurs. The delay between a state change of the data signal and a state change of the clock signal can be determined by counting strobe pulses therebetween.

A strobe can be generated by generating a first pulse using a conventional edge generator, applying the first pulse to delay circuitry including a plurality of delay elements and providing a connection between each of the delay elements to receive a sequentially delayed copy of the first pulse. The delay circuitry can be controlled by a delay locked loop wherein the delay elements include controllable summing elements being tunable to correct delay line errors.

In an illustrative embodiment, the strobes can be applied to the data or clock signals by applying each of the strobe pulses as a latch-clock signal to a corresponding latch of a plurality of latches. The data or clock signal is applied to the input of each of the latches and the state of the data or clock signal is received as output of each of the latches.

Storing of the data signals can be performed by receiving strobed samples of the states of the data signal in parallel as a series of samples and encoding the strobed samples as a digital word to identify time and polarity of a state change. In an illustrative embodiment, the encoding step results in a 6-bit word of which five bits identify the time of the state change and one bit identifies the polarity of the state change.

In an illustrative embodiment, the transmission of digital words is performed by de-multiplexing the digital words to reduce data transfer rate of the words. For example, in a particular embodiment transmission of 6-bit words at 2 gigabytes per second is de-multiplexed by ⅛ to transmit 48-bit words at 250 megabytes per second. The 48-bit words represent eight 5-bit words representing edge times and their corresponding eight polarity bits. The de-multiplexed words are then stored in random access memory at the reduced transfer rate. In the illustrative embodiment, the words representing the edge time and polarity of sampled data signals are stored in a 95×40 random access memory.

The stored states or edge times of data signals are compared with the edge times of the sampled clocks by selecting the de-multiplexed words identifying edge times of the clock signal having a set polarity bit and using the selected word as a pointer to the random access memory wherein the data edge time and polarity are stored. The selected word can be distributed to a plurality of channels over a bus wherein the selected word is used as a pointer to random access memory on a recipient channel. In an illustrative embodiment, the data in random access addressed by the selected word is compared with expected data and a pass or fail indication is provided as a result of the comparison. The data in random access memory addressed by the selected word can be pipelined as known in the art to correct for system path delays, by passing the edge times of the data signal through sequential storage locations a predetermined number of times to pass time needed for edge times of the clock signal to reach the random access memory.

In a particular illustrative embodiment of the invention, the timing of a data signal can be tested by applying a first strobe initiator pulse to a first plurality of delay elements to generate a plurality of delayed copies of the first strobe initiator pulse. A data signal is applied to the input of each of a first plurality of latches. Each of the plurality of delayed copies of the first strobe initiator pulse are applied as a latch-clock signal to a corresponding latch of the first plurality of latches. A plurality of samples of the data signal is thereby acquired. The plurality of samples of the data signal are encoded to form a first digital word which identifies a time and polarity of a state change in the data signal. The first digital word is stored in random access memory.

A second strobe initiator pulse is applied to a second plurality of delay elements to generate a plurality of delayed copies of the second strobe initiator pulse. A clock signal is applied to the input of each of a second plurality of latches. Each of the plurality of delayed copies of the second strobe initiator pulse are applied as a latch-clock signal to a corresponding latch of the second plurality of latches. A plurality of samples of the clock signal is thereby acquired.

The plurality of samples of the clock signal are encoded to form a second digital word which identifies a time and polarity of a state change in the clock signal. The delay between a state change of the data signal and a state change of the clock signal is determined by comparing the second digital word with the first digital word stored in random access memory. The second digital signal can be provided for use in testing the timing of a plurality of channels by routing the second digital word onto a clock bus.

Another aspect of the present invention is an apparatus for testing timing of a synchronous bus. In an illustrative embodiment, the apparatus includes a sampler with a plurality of closely spaced increasing strobe delays. Each delayed pulse triggers a latch which samples a data signal or a synchronous clock signal.

An encoder in communication with the sampler transforms the sampled data and clock signals to edge time and polarity data in a binary word. If the samples are data signal samples, rather than synchronous clock samples, memory in communication with the encoder stores the binary word. If the samples are synchronous clock samples, routing circuitry in communication with the encoder selects the binary word having a set polarity and routes the binary word to a clock bus for use on a plurality of channels.

Random access memory address lines in communication with the clock bus are configured to select clock time data on the bus and use it to address data edge times and polarity stored in the random access memory. First compare circuitry is placed in communication with the RAM for comparing the clock time data to the data stored in the random access memory. Second compare circuitry is placed in communication with the first compare circuitry to compare expected values of the data at specific clock times with actual values represented by data in the random access memory. In an illustrative embodiment, de-multiplexing circuitry in communication with the encoder is adapted to reduce the rate of data transfer into the random access memory.

BRIEF DESCRIPTION OF THE DRAWINGS

The foregoing and other features and advantages of the present invention will be more fully understood from the following detailed description of illustrative embodiments taken in conjunction with the accompanying drawings in which.

DETAILED DESCRIPTION

Figure 1:
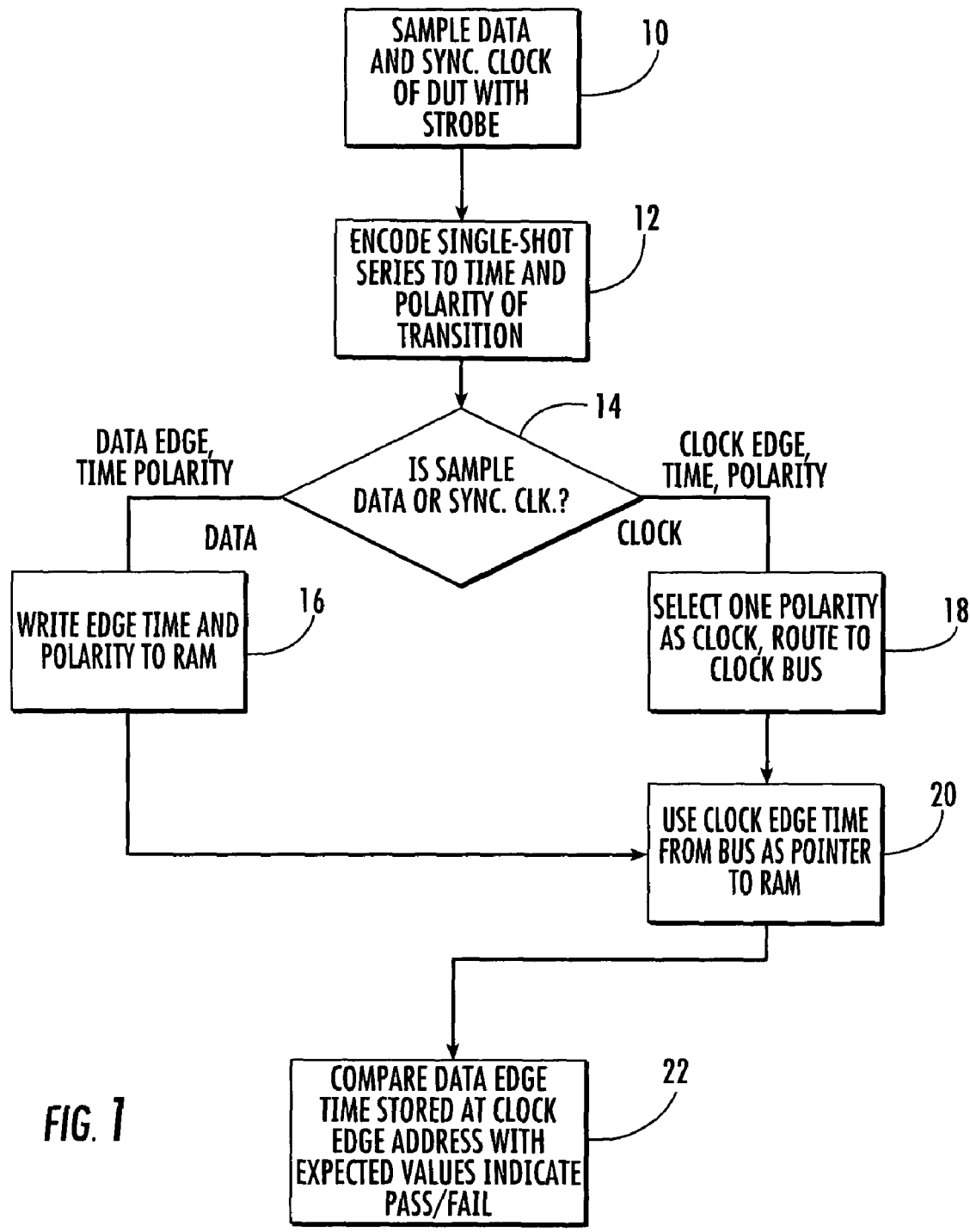
FIG. 1 is a functional block diagram of a method for testing synchronous clock buses according to an illustrative embodiment of the present invention.

An illustrative method for testing and evaluating synchronously-clocked data without directly comparing the synchronous clock signals to the data signals under test is described generally with reference to FIG. 1.

In a sampling step 10, data signals and clock signals of a device under test (DUT) are sampled to acquire binary values of their states at a high rate using a closely spaced strobe. These binary values are latched by a set of latches, each of which is triggered by a corresponding one of the closely spaced strobe pulses. The sampled data is thus acquired latched as a single-shot series of closely spaced samples of the data signal or clock signal under test. It should be understood that various embodiments of the invention may have multiple single-shot series.

It should be understood by persons skilled in the art that the term "closely spaced" as used throughout the present specification to describe a series of strobe pulses or signals should be broadly interpreted and that such spacing may vary according to the needs of a particular test application. It should be understood that "closely spaced" pulses or signals have a higher frequency than the signal under test or clock signal, or may have the same frequency relative to the timing of a device under test.

Within the single shot series, an edge time and edge polarity of a data signal or clock signal are detected. In an encoding step 12, the detected edge time and polarity are encoded in a binary word. In an illustrative embodiment, the encoded edge time is represented as the five least significant bits of a 6-bit word and the polarity is represented as the most significant bit.

In an example of high speed test equipment using the present method, the encoded 6-bit words are generated at about 2 gigabytes per second. To provide a data rate more suitable for the storage and comparison steps downstream, the encoded words may be de-multiplexed to provide 48-bit words at only 250 megabytes per second. The 48-bit words represent eight 5-bit edge times and the corresponding eight 1-bit edge polarities.

In a selector step 14, it is determined whether the encoded data represents the edge time and polarity of a sampled data signal or the edge time and polarity of sampled clock signal. This determination can be performed, for example, by predetermination of the channels upon which clock signals and data signals are transmitted, or by applying a separate signal to switching circuitry which indicates whether the present input is a clock or data signal. If the encoded data represents the edge time and polarity of a sampled data signal, a storage step 16 is performed in which the encoded data is stored in random access memory. In the illustrative embodiment a 96×40 random access memory is used to store the encoded data. Persons skilled in the art should appreciate that switching circuitry can easily be configured in various ways to so direct the encoded data.

If the encoded data represents the edge time and polarity of a sampled synchronous clock signal, then only encoded data having one polarity is selected and used as a clock edge time. In a clock selection step 18, the encoded clock edge time is routed to a clock bus. Thus, the clock edge data can be routed to a plurality of channels and used in one or more chips.

In a memory accessing step 20, the clock data is used as a pointer to the random access memory address of corresponding encoded data signal edge time. In a comparison step 22, the data edge time found in memory at the clock address is compared to an expected value to determine whether the represented data signal edge time is within pre-specified limits of the represented clock edge time. A pass/fail indication can thereby be automatically generated. The data in random access memory addressed by the clock data can be pipelined as known in the art to correct for system path delays, by passing the edge times of the data signal through sequential storage locations a predetermined number of times to pass time needed for edge times of the clock signal to reach the random access memory.

Figure 2:
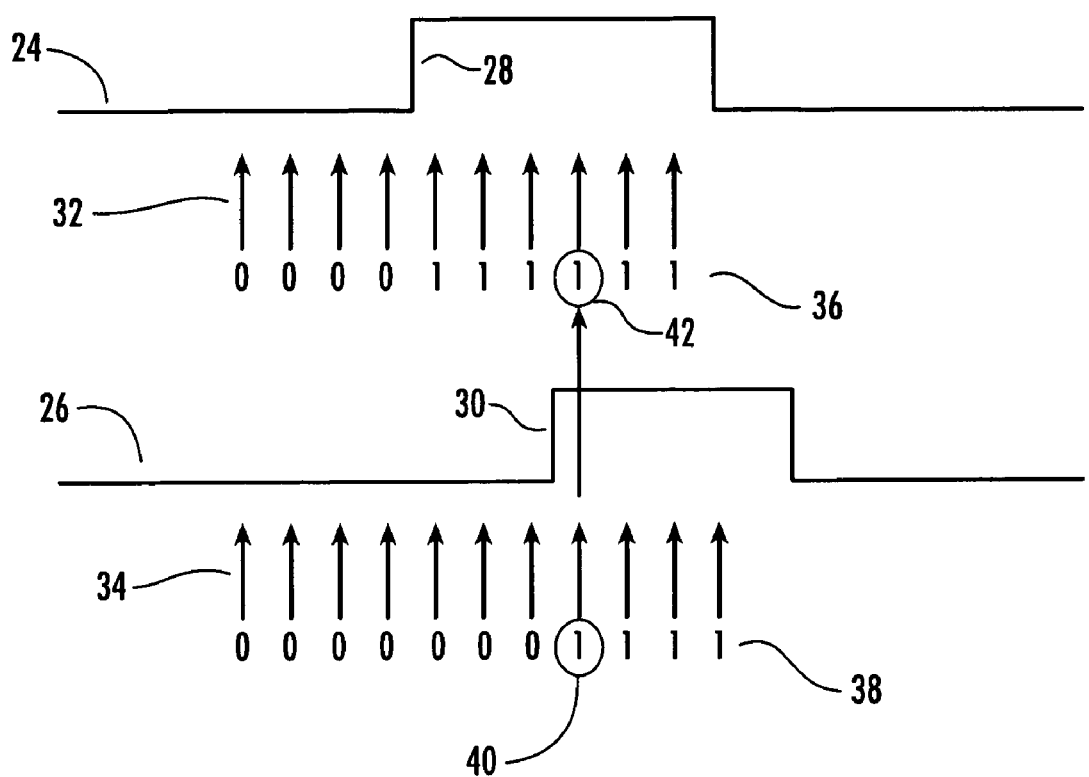
FIG. 2 is a schematic timing diagram showing the application of a closely spaced strobe to data signals and synchronous clock signals according to an illustrative embodiment of the present invention.

The sampling step 10 is performed to acquire closely spaced readings of the state of a data signal and/or clock signal of the DUT. FIG. 2 is a schematic timing diagram showing an example of the relative timing of a data signal 24 and a clock signal 26 of a device under test. The data signal 24 in a device under test is shown as a voltage/logic level that changes state at edge 28. The clock signal 26 changes state at edge 30. The strobes 32, 34 provide closely spaced pulses which each trigger a sampling of the state of the data signal under test.

The sampling thereby results in a series of bits 36, 38 indicating the state of the data or clock signal under test at closely spaced time intervals. A change of state 40 in the series of bits 38 representing the clock signal can be used as a timing reference for comparison against the state 42 of the data signal in the series of bits 36 representing the data signal. In the illustrative embodiment, the series of bits 36 and 38 are further encoded before a comparison is made therebetween as described herein with reference to FIG. 1 and FIG. 4.

Figure 3:
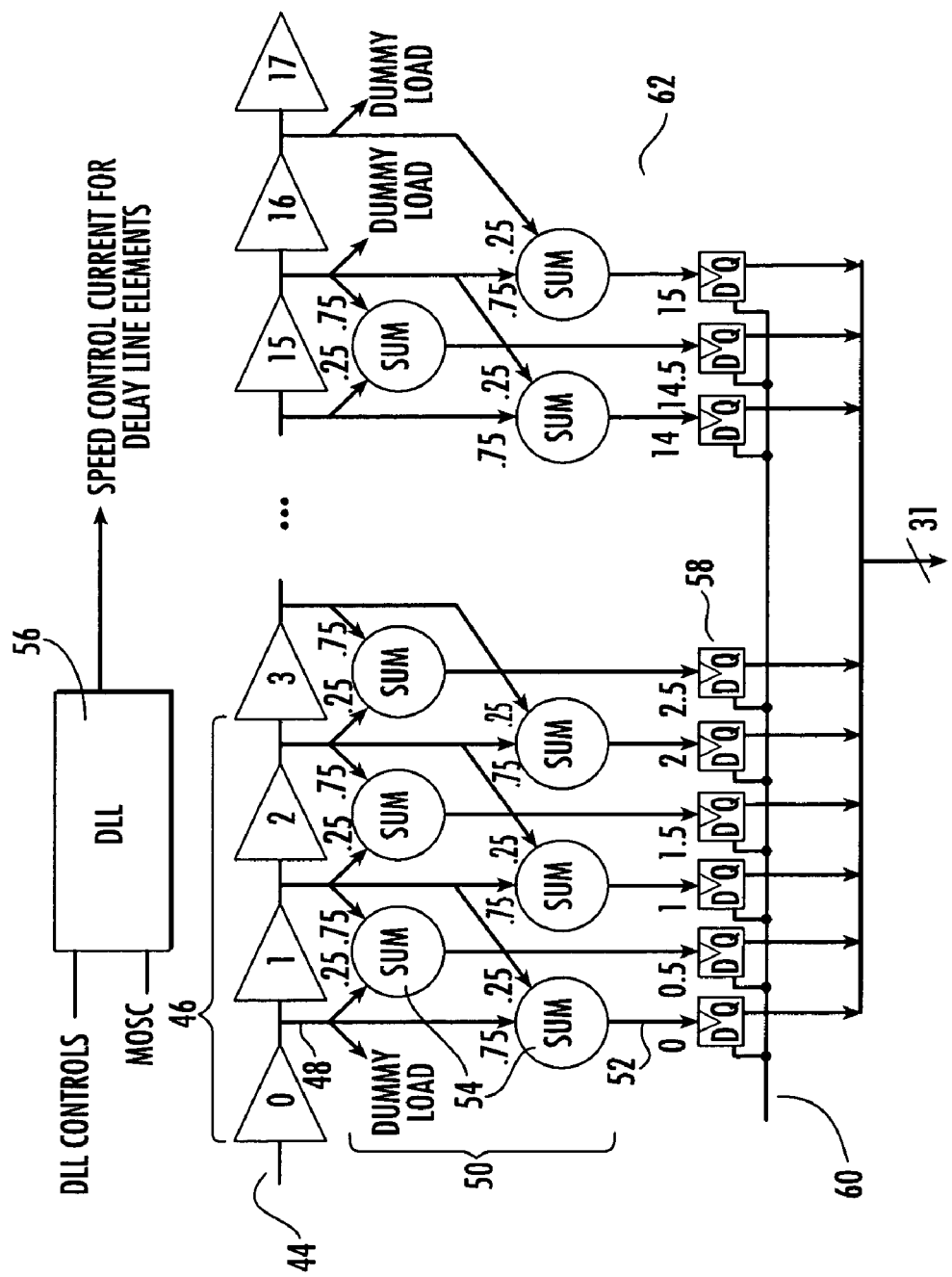
FIG. 3 is a schematic diagram of multi-strobe sampler according to an illustrative embodiment of the present invention.

A sampling circuit 62 for acquiring strobed samples of a data or clock signal under test is shown in FIG. 3. A strobe initiator signal such as a single strobe pulse is generated by a conventional edge generator and applied to a delay line input 44. A series of delay elements output incrementally delayed copies 48 of the strobe initiator signal. In the illustrative embodiment, the incrementally delayed copies 48 of the strobe initiator signal are directed through summing circuitry 50 as known in the art to interpolate between the delay elements and thereby provide more closely spaced copies 52 of the strobe initiator signal.

In the illustrative embodiment, the summing circuitry 50 includes summing elements 54 which each comprise a Gilbert cell based on a fine vernier with 8 settings (i.e., 3-bit control). The settings can be tuned to correct delay line errors. Speed control currents for the delay line elements 46 are provided by a delay locked loop 56. Each of the closely spaced delayed copies of the strobe initiator signal are provided to the clock input of a corresponding D-latch 58. The data signal or synchronous clock signal under test 60 is routed to the input to each of the D-latches. As a result, the data stored in the D-latches represents a binary snap shot of the states of the data signal, or clock signal under test. In the illustrative embodiment, a set of 31 D-latches is used to capture a 31-bit wide, strobed representation of the signal under test.

Figure 4:
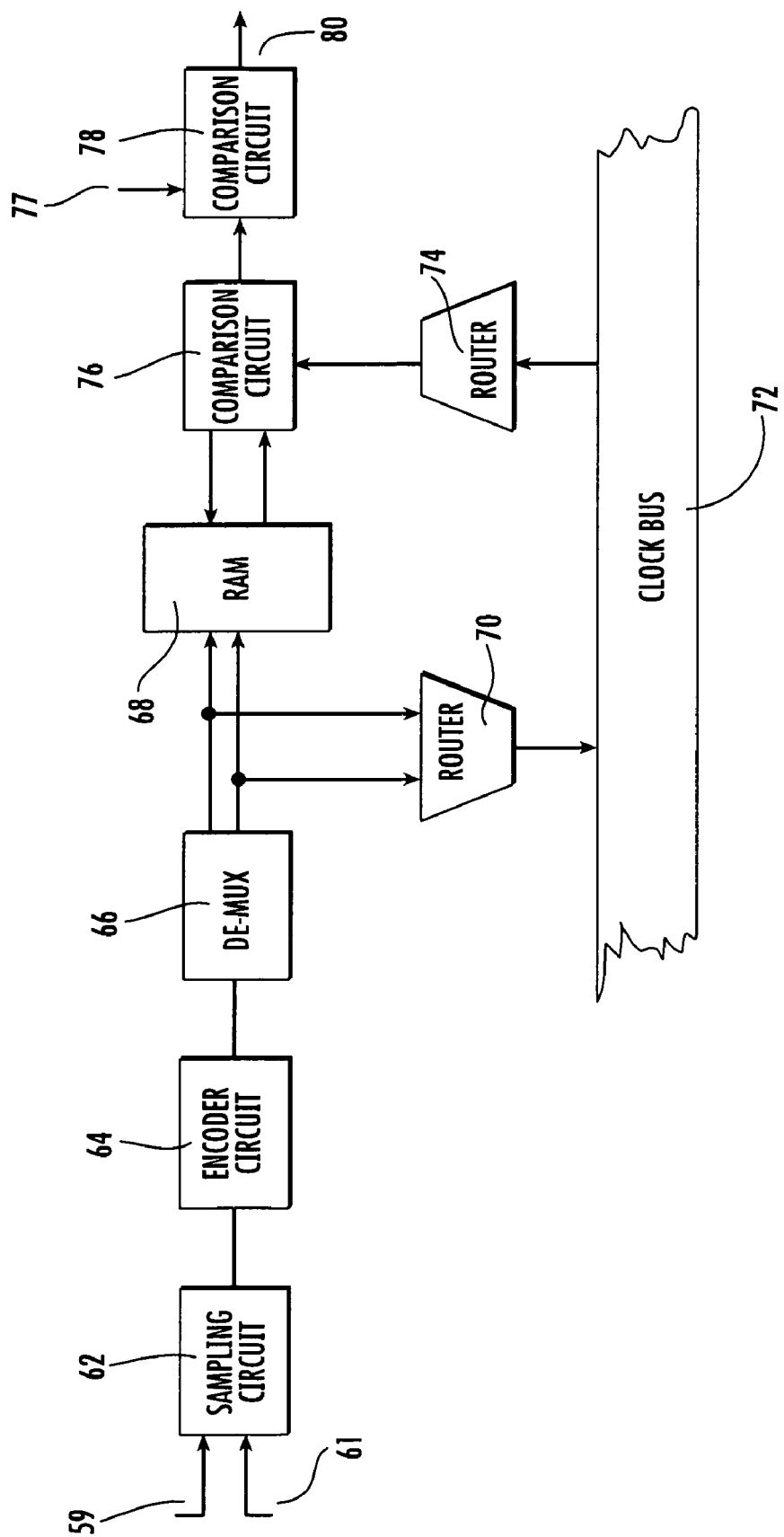
FIG. 4 is a schematic diagram of an apparatus for testing synchronous clock buses according to an illustrative embodiment of the present invention.

An apparatus for using a strobed representation of the synchronous clock to test data signals in a DUT is described with reference to FIG. 4. A signal under test 59 and a strobe 61 are applied to a sampling circuit 62. In the illustrative embodiment, the sampling circuit 62 is the sampling apparatus described in detail with respect to FIG. 3. An encoder circuit 64 in communication with the sampling circuit 62 accepts the closely spaced strobed representation of the signal under test from the sampling circuit 62 and converts it to a data word representing an edge time and an edge polarity, (i.e., high to low or low to high). In the illustrative embodiment, the encoder converts a 31-bit binary snap shot of the edge transition to a 6-bit word. The most significant bit is used to represent the edge polarity and the remaining five bits are used to represent the edge time. Although the encoding described herein uses 6-bit words and 1-bit polarity representation for purposes of illustration, persons having ordinary skill in the art should appreciate that numerous other word lengths can be used and data can be encoded therein under other schemes within the scope of the present invention.

In the illustrative embodiment of the invention, the 6-bit words are output from the encoder at about 2 gigabytes per second. A de-multiplexer 66 in communication with the encoder 64 is used to convert the data into 48-bit words at a data rate of 250 megabytes per second. The 48-bit words include eight 5-bit data words representing edge times and their corresponding eight single polarity bits. Persons having ordinary skill in the art should appreciate that de-multiplexing may not be necessary in all cases and that various other bit rates and/or de-multiplexing details can be chosen within the scope of the present invention.

Router circuitry 70 is used to route signals that represent the synchronous clock of the DUT onto a tester clock bus 72. The routing circuitry 70 also selects only clock edge times with one polarity to represent a system clock, i.e., selects edge times representing a clock set (up polarity) and disregards of the clock reset (down polarity). The clock edge times thereby routed to a tester bus 72 can be used on a plurality of channels.

The words output from the de-multiplexer 66 that represent data signals of a DUT are not selected as clock signals and are stored directly in RAM 68. In the illustrative embodiment, the data is stored in 96×40 RAM. Persons having ordinary skill in the art should appreciate that numerous other RAM configuration can be used within the scope of the present invention.

The clock edge times on the tester bus 72 are used as pointers to address the data stored in RAM 68. Routing circuitry 74 selects which clock on the bus to use as a pointer and routes that clock edge time to comparison circuit 76. Comparison circuit 76 provides the clock edge time as an address to RAM 68 and reads the data edge time stored at that address. The data edge time thereby addressed in RAM is compared with the clock edge time to determine the difference therebetween.

Comparison circuitry 78 compares expected values 77 of the difference between a data edge and synchronous clock edge with the difference found by comparison circuit 76. The comparison circuitry 78 outputs pass or fail signals 80 for each comparison according to whether the difference from expectations is within specified limits.

Accordingly, the various embodiments of the present invention provide a means for representing a signal under test in terms of its precise edge times and polarity of transition at the corresponding edge times. The edge times and polarities thus represented are stored for comparison with a timing signal such as the synchronous clock of a device under test. The timing signal is also represented in terms of its precise edge times. This representation of the timing signal edge time can be provided to a clock bus for use throughout a test system, for example, to compare with a corresponding data signal edge time in RAM. The result of such a comparison can be checked against an expected value to determine whether a device under test is in compliance with test specifications.

Although illustrative embodiments of the present invention are described herein generally in terms of strobe pulses, persons having ordinary skill in the art should understand that strobe pulses can include application of a threshold voltage in a cycle of various wave forms such as square wave signals, sine waves signals, triangular waves, impulses and the like to trigger a corresponding latch. For example, it is envisioned that a leading edge of a rectangular wave pulse can be used as a strobe pulse in illustrative embodiments of the invention.

Although illustrative embodiments of the present invention are described herein generally in terms of a strobe generated by a series of sequential delay elements, persons having ordinary skill in the art should appreciate that delay elements may be configured in a number of alternative configurations without departing from the scope of the present invention. For example, it is envisioned that a strobe initiator pulse can be applied to a plurality of delay elements arranged in parallel rather than in series within the scope of the present invention. It is also envisioned that combinations of series and parallel delay elements can be configured to a plurality of closely spaced copies of a strobe initiator signal within the scope of the invention.

Although illustrative embodiments of the present invention are described herein generally in terms of automatic test equipment, persons having ordinary skill in the art should understand that the present invention can be useful in many other signal comparison operations. For example, it is envisioned that the present invention will find utility as a timing element in an unlimited number of high speed processing applications.

It should be understood that various modifications may be made to the embodiments disclosed herein. Therefore, the above description should not be construed as limiting, but merely as exemplification of the various embodiments. Those skilled in the art should envision other modifications within the scope and spirit of the claims appended hereto.

What is claimed is:

1. A method for testing timing of a data signal, comprising:
    applying a first strobe initiator pulse to a first plurality of delay elements to generate a plurality of delayed copies of the first strobe initiator pulse;
    applying a data signal to an input of each of a first plurality of latches;
    applying each of the plurality of delayed copies of the first strobe initiator pulse as a latch-clock signal to a corresponding latch of the first plurality of latches wherein a plurality of samples of the data signal is thereby acquired;
    encoding the plurality of samples of the data signal to form a first digital word which identifies a time and a polarity of a state change in the data signal;
    storing the first digital word in random access memory;
    applying a second strobe initiator pulse to a second plurality of delay elements to generate a plurality of delayed copies of the second strobe initiator pulse;
    applying a clock signal to an input of each of a second plurality of latches;
    applying each of the plurality of delayed copies of the second strobe initiator pulse as a latch-clock signal to a corresponding latch of the second plurality of latches wherein a plurality of samples of the clock signal is thereby acquired;
    encoding the plurality of samples of the clock signal to form a second digital word which identifies a time and a polarity of a state change in the clock signal; and
    determining a delay between the state change in the data signal and the state change in the clock signal by comparing the second digital word with the first digital word.

2. The method according to claim 1, further comprising:
    providing the second digital word for use in testing the timing of a plurality of channels by routing the second digital word onto a clock bus.

3. The method according to claim 1, wherein the first plurality of delay elements includes controllable summing elements tunable to correct delay line errors.

4. An apparatus for testing timing of a synchronous bus, comprising:
    a sampler comprising a plurality of increasing strobe delays each triggering a corresponding latch which samples a data signal or a clock signal to form sampled data;
    an encoder in communication with the sampler which transforms the sampled data or clock signals to edge time data and polarity data in a binary word;
    memory in communication with the encoder, the memory storing the binary word as a data binary word if the samples are data signal samples;
    routing circuitry in communication with the encoder, the routing circuitry selecting the binary word having a set polarity if the samples are sampled clock signals and routing the binary word to a clock bus as clock time data;
    memory address lines in communication with the clock bus and configured to select clock time data and use the clock time data to address the data binary word stored in the memory;
    first compare circuitry in communication with the memory for comparing the clock time data to the data binary word stored in the memory;
    second compare circuitry in communication with the first compare circuitry, the second compare circuitry comparing expected values of the data binary word at specific clock times with actual values represented by the data binary word in the memory.

5. The apparatus according to claim 4, further comprising de-multiplexing circuitry in communication with the encoder wherein the de-multiplexing circuitry reduces a rate of data transfer into the memory.

* * * * *